United States Patent [19]

Chrysler et al.

[11] Patent Number: 5,303,555
[45] Date of Patent: Apr. 19, 1994

[54] ELECTRONICS PACKAGE WITH IMPROVED THERMAL MANAGEMENT BY THERMOACOUSTIC HEAT PUMPING

[75] Inventors: Gregory M. Chrysler, Poughkeepsie; David T. Vader, New Paltz, both of N.Y.

[73] Assignee: International Business Machines Corp., Armonk, N.Y.

[21] Appl. No.: 969,709

[22] Filed: Oct. 29, 1992

[51] Int. Cl.$^5$ .............................................. F25B 9/00
[52] U.S. Cl. ........................................ 62/6; 60/520; 62/259.2
[58] Field of Search ...................... 62/6, 259.2; 60/520

[56] References Cited

U.S. PATENT DOCUMENTS

| | | | |
|---|---|---|---|
| 3,237,421 | 3/1966 | Gifford | 62/88 |
| 4,114,380 | 9/1978 | Ceperley | 60/721 |
| 4,355,517 | 10/1982 | Ceperley | 60/721 |
| 4,398,398 | 8/1983 | Wheatly et al. | 62/467 R |
| 4,489,553 | 12/1984 | Wheatly et al. | 60/516 |
| 4,584,840 | 4/1986 | Baumann | 62/6 |
| 4,625,517 | 12/1986 | Muller | 60/721 |
| 4,722,201 | 2/1988 | Hofler et al. | 62/6 |
| 4,858,441 | 8/1989 | Wheatley et al. | 62/6 |
| 4,953,366 | 9/1990 | Swift et al. | 62/467 |
| 5,165,243 | 11/1992 | Bennett | 62/6 |
| 5,167,124 | 12/1992 | Lucas | 62/6 |
| 5,174,130 | 12/1992 | Lucas | 62/6 |

OTHER PUBLICATIONS

Development of a Practical Pulse Tube Refrigerator: Coaxial Designs and the Influence of Viscosity by R. N. Richardson, Cryogenics 1988 vol. 28, Aug. pp. 516–520.
Valved Pulse Tube Refrigerator Development by R. N. Richardson, Cryogenics 1989 vol. 29, Aug. 1989, pp. 850–853.
Double Inlet Pulse Tube Refrigerator: An Important Improvement by Zhu Shaowei, et al., Cryogenics 1990 vol. 30, Jun. 1990, pp. 514–520.
An Experimental Investigation of Pulse Tube Refrigeration Heat Transfer Rates by Marc David, et al., CEC 1989.
Development and Experimetnal Test of an Analytical Model of the Orifice Pulse Tube Refrigerator, by Peter Storch, et al., Advances in Cryogenic Engineering, vol. 33, pp. 851–859.
Influence of Gas Velocity on Surface Heat Pumping for the Orifice Pulse Tube Refrigerator, by J. M. Lee, CEC 1989, pp. 1–8.
Pulse Tube with Axial Curvature, by Yuan Zhou, et al., Advances in Cryogenic Engineering, vol. 33, pp. 861–868.
Pulse Tube Refrigerator Performance, by E. Tward, et al., CEC 1989, pp. 1–6.
A Comparison of Three Types of Pulse Tube Refrigerators: New Methods for Reaching 60K, by Ray Radevabaugh, Advances in Cryogenic Engineering, vol. 31, pp. 779–789.
Developmet of a Single Stage Pulse Tube Refrigerator Capable of Reaching 49K, by Jingtao Liang, et al., Cryogenics 1990, pp. 49–51.
Thermoacoustic Engines by G. W. Swift, Journal of Acoustics Society of America, vol. 84, No. 4, Oct. 1988, pp. 1145–1180.
A Pistonless Stirling Engine–The Traveling Wave Heat Engine, by Peter H. Ceperley, Journal of Acoustics Society of America, vol. 66, No. 5, Nov. 1979.
Pulse Tube Refrigeration Progress, by W. E. Gifford, et al., International Advances in Cryogenic Engineeering, Proceedings of the 1964 Cryogenic Engineering Conference, 1965, pp. 69–79.

*Primary Examiner*—Ronald C. Capossela
*Attorney, Agent, or Firm*—Lawrence D. Cutter

[57] ABSTRACT

Electronic chips are cooled to an efficient operating temperature by engaging their exposed planar surfaces with a heat sink assembly. The heat sink assembly is a part of the cold end heat sink of a thermoacoustic heat pump that utilizes either traveling wave or standing wave heat pumping to transport heat from the cold end heat exchanger to the warm end heat exchanger, utilizing a coaxial pulse tube refrigerator to pump or transport the heat from the electronic chips and the cold end heat exchanger.

19 Claims, 5 Drawing Sheets

ELECTRONICS PACKAGE WITH IMPROVED THERMAL MANAGEMENT BY THERMOACOUSTIC HEAT PUMPING

FIELD OF THE INVENTION

This invention relates to the cooling of electronic circuit chips and more particularly to a thermoacoustic cryogenic refrigeration unit for cooling an electronic package.

BACKGROUND OF THE INVENTION

Cryogenic cooling of electronic circuit elements has been known and used in the manufacture of large scale computers. With a large scale computer and a large number of electronic assemblies to cool, cryogenic cooling may be a justifiable expense. However, while it is desirable to cool only a single electronic chip in a computer work station or a computer terminal, the cost and the equipment required to accomplish such cryogenic cooling is not justifiable. Because of the lack of adequate cooling, certain electronic chips may not be used in stand-alone terminals or in work stations because the electronic chip cannot be maintained at a cool enough temperature to function reliably or efficiently. The cooling of a small number of chips, all closely positioned to each other, may also be accomplished by employing the present invention in a larger size. Larger sizes may accommodate electronic assemblies having 2 to 16 chips. When the number of chips cooled increases, the heat load increases correspondingly. While it may be desirable, it may not be necessary to cool the chips to cryogenic levels. Presently, electronic devices typically operate in ranges from 0° C. to 100° C. The upper limit temperature of 100° C. is not the desired operating temperature and to increase reliability of the chips the upper limit is reduced. Desired device operating temperatures from 0° C. to 35° C. are typical. Temperatures below 20° C. are not attainable with unassisted air cooling, and temperatures between 20° C. and 35° C. usually can not be achieved with practical air cooled packaging. Accordingly, chilled water with its attendant plumbing requirements is typically used to limit the operating temperature, if the lower temperatures are to be maintained. Subambient temperatures are difficult to implement even with water, due to the condensate which readily forms on the cooling fixtures, and can damage electronic components.

As the power of computers increases and more of the processing capability of computers is packaged within stand-alone devices such as work stations and individual terminals or on a single module in a larger computer, it becomes necessary to adequately cool the electronic components of the terminal, work station or module to insure proper operation of the computer. In some instances, it is only necessary to cool a few of the electronic components, or possibly even as little as one electronic component, to substantially lowered temperatures.

When only a few or only one electronic component is to be cooled to lower temperatures than those attainable with conventional air or water cooling, the approach to cooling that element must, of necessity, depart from the conventional systems used in today's main frame computers with many large multi-chip modules, if for no other reason, than for cost and equipment requirements.

Significant amounts of research have been done on a refrigeration process and apparatus which utilizes thermoacoustic refrigeration. In a pulse tube, a form of thermoacoustic refrigeration, a gas is compressed and expanded in pulses and the affect of the alternating compression and expansion of the gas contained within the pulse tube apparatus is that heat flows or is transported from one end of the pulse tube at a lower temperature to the other end at a higher temperature. Publications which describe the structure and operation of pulse tube refrigeration apparatus include:

Development of A Practical Pulse Tube Refrigerator: Coaxial Designs and The Influence of Viscosity by R. N Richardson, Cryogenics 1988 Volume 28, August, pages 516-520; Valved Pulse Tube Refrigerator Development, by R. N. Richardson, Cryogenics 1989 Volume 29, August 1989, pages 850-853; Double Inlet Pulse Tube Refrigerator: An Important Improvement by Zhu Shaowei, et al., Cryogenics 1990 Volume 30, June 1990, pages 514-520; Pulse Tube Refrigeration Process by W. E. Gifford, et al., International Advances In Cryogenic Engineering 1965, pages 69-79; An Experimental Investigation of Pulse Tube Refrigeration Heat Transfer Rates, by Marc David, et al., CEC 1989; Development and Experimental Test of An Analytical Model of the Orifice Pulse Tube Refrigerator, by Peter Storch, et al., Advances In Cryogenic Engineering, Volume 33, pages 851-859; Influence of Gas Velocity On Surface Heat Pumping For The Orifice Pulse Tube Refrigerator, by J. M. Lee, CEC 1989, pages 1-8; Pulse Tube With Axial Curvature, by Yuan Zhou, et al., Advances In Cryogenic Engineering, Volume 33, pages 861-868; Pulse Tube Refrigerator Performance, by E. Tward, et al., CEC 1989, pages 1-6; A Comparison of Three Types of Pulse Tube Refrigerators: New Methods For Reaching 60K, by Ray Radevabaugh, Advances In Cryogenic Engineering, Volume 31, pages 779-789; and Development of A Single Stage Pulse Tube Refrigerator Capable of Reaching 49K, by Jingtao Liang, et al., Cryogenics 1990, pages 49-51.

Additional publications describing apparatus and processes related to the type of device disclosed herein includes: Thermoacoustic Engines by G. W. Swift, Journal of Acoustics Society of America, Vol. 84, No. 4, October 1988, pages 1145-1180; A Pistonless Stirling Engine—The Traveling Wave Heat Engine, by Peter H. Ceperley, Journal of Acoustics Society of America, Vol. 66, No. 5, November 1979; and Pulse Tube Refrigeration Progress, by W. E. Gifford, et al., International Advances in Cryogenic Engineering, Proceedings of the 1964 Cryogenic Engineering Conference, 1965, pages 69-79.

U.S. Pat. No. 3,237,421 to W. E. Gifford describes a pulse tube method of refrigeration and apparatus.

U.S. Pat. Nos. 4,114,380 and 4,355,517 to Peter H. Ceperley describe traveling wave heat engines.

U.S. Pat. No. 4,953,366 to Swift, et al., describes a serial acoustic cryo cooler.

U.S. Pat. No. 4,625,517 to Muller discloses a thermal acoustic device wherein rod like elements are contained in the chamber between the heat source and the heat sink.

U.S. Pat. No. 4,584,840 to Baumann discloses a cooling machine or heat pump of the thermal acoustic type.

U.S. Pat. No. 4,489,553 and U.S. Pat. No. 4,398,398 both to John C. Wheatly, et al., disclose a heat engine utilizing an acoustic drive to transfer heat from a heat source to a heat sink.

In one class of heat pumping machines, known as thermoacoustic heat pumps, acoustical or pressure pulse work is input to the machine, which causes heat to flow from a lower temperature heat source to a higher temperature heat sink. Thermoacoustic heat pumps are inherently more reliable than many other heat pumps since there are no moving parts at low temperature. Some devices of this type can have no moving parts at all. There are two mechanisms by which this heat pumping can be achieved. The first is surface heat pumping, which can occur in the presence of a standing pressure wave. The second is related to the conventional Stirling-cycle heat pumping process, and can occur in the presence of a traveling pressure wave.

In a typical embodiment of a stationary or standing pressure wave thermoacoustic machine, as described in U.S Pat. No. 4,489,553, a compressible fluid in a tube is cyclically compressed and expanded by a sinusoidal drive mechanism at one end of the tube, while the other end of the tube is closed. The frequency of pressure oscillations is that of a standing wave for the enclosure. A second, stationary thermodynamic medium, which can be uniformly spaced parallel plates, concentric cylinders, cylindrical or square rods, etc. is placed in the tube such that it lies between a velocity node and antinode (i.e. where velocity and pressure fluctuations are both non-zero). This second medium is commonly known as the stack. The reciprocal motion of the fluid relative to the stack makes possible the continual flow of heat from the end of the stack that is closer to a velocity antinode, where heat flows into the stack at one temperature, to the end that is closer to a velocity node, where heat is rejected from the stack at a higher temperature.

The following stack characteristics are known to be required for surface heat pumping: low impedance to fluid flow along the axis of the tube, low axial thermal conduction, a high surface area-to-volume ratio, and imperfect thermal contact with the fluid. The concept of imperfect thermal contact describes conditions where heat may be absorbed from or rejected to the fluid (i.e., the effective heat capacity of the stack media, considering the conduction penetration depth at the frequency of operation, is much larger than that of the fluid), and the thermal relaxation time for heat exchange between the fluid and stack is inversely related to the driving frequency. The dimensions and spacing between elements in the stack are determined by known optimization criteria. Heat flows into and out of a conventional standing wave thermoacoustic heat pump through the walls of the tube, to which the stack must be thermally anchored. A conventional method of facilitating the flow of heat from the tube walls to the ends of the stack is to make the ends of the stack from a second, high conductivity material, which is attached to the walls of the tube. This is in contrast to the low conductivity material that is required to meet the aforementioned criteria for low axial conduction and imperfect thermal contact with the fluid.

Of particular interest to the present invention is the co-axial arrangement, which is comprised of two concentric tubes that form a core volume and an annular volume. This co-axial arrangement has been applied to pulse tube thermoacoustic engines, in which heat pumping can be accomplished by both the standing and traveling wave mechanisms. Flow between the tubes is permitted at one end. In one version of the co-axial arrangement, the regenerator and driver are placed in the inner tube, and the pulse "tube" is the annular space between the inner and outer tubes. In another version, the driver and regenerator occupy the annular volume, while the core volume is the pulse tube.

The cryo cooler refrigerators described in the foregoing patents and publications are primarily research apparatus and the descriptions do not apply the apparatus to a use for which the devices may be advantageously adapted or do not teach how the pulse tube refrigeration unit is adapted for practical application.

Thermoacoustic refrigeration and particularly pulse tube type refrigeration apparatus appear, from the foregoing publications and patents, to have progressed to the point where the thermoacoustic refrigeration capability may be implemented and used in devices requiring reliable cost effective refrigeration in a relatively small volume.

SUMMARY OF THE INVENTION

The adaptation of the theoretical process and the implementation of apparatus capable of producing a utilitarian result are described herein. An object of the invention is to utilize the refrigeration capability of a thermoacoustic refrigerator to cool electronic chips.

Another object of the invention is to provide relatively small, economical and reliable cooling systems for the cooling of electronic chips within small computers, work stations and/or a single processor module within a larger computer.

It is still another object of this invention to increase the maximum permitted device power dissipation and/or decrease device temperatures in an electronic circuit module, by interposing a thermoacoustic heat pumping device between the electronic devices and a heat sink.

It is a further object of this invention to provide means for thermally coupling single and multichip electronic circuit modules to a thermoacoustic heat pump.

The objects of the invention are accomplished by the positioning of a concentric or coaxial design thermoacoustic refrigeration apparatus over and in thermal contact with an electronic chip supported by a chip carrier, in such a way that the cold end heat sink of the thermoacoustic refrigeration device will absorb heat from the electronic chip when the chip is operated and generates heat.

In one embodiment of this invention, a multichip circuit module comprises microelectronic computer chips arranged in a row and column array and attached to a metalized ceramic substrate by means of metal contacts or solder balls. The substrate has pins or other electrical contacts extending from the side opposite the chips, which provide means for plugging or otherwise connecting the module to a board or other receptacle that may carry connecting electronic circuitry. Conduction cooling hardware, which comprises a heat sink and chip contacting elements or media, is joined to the ceramic substrate. An array of plate-like fins is incorporated into the heat sink. This finned module assembly forms one end of a co-axial pulse tube thermoacoustic refrigerator, replacing the conventional cold-end heat exchanger. The surface of the heat sink facing into the refrigerator (i.e., the base of the fins) and the free end of the inner tube may be contoured to form a passage that is favorable to flow between the annular and core volumes of the refrigerator. While a generic cross-sectional shape of this flow passage is described below, the specific shape of the contours is chosen to optimize refrigerator performance by reducing the flow turning pressure drop and disturbances to the desired standing and/or traveling waves. Heat flows by conduction from the chips into and through the contacting elements of the heat sink, which may include pistons, radial fingers or a thermally conductive paste, and into the heat sink. Heat is then dissipated from the heat sink through the fins, which are convectively cooled by the working fluid in the pulse tube refrigerator. The fin height and pitch are selected to balance the surface area, convection coefficient and pressure drop to optimize performance for the specified total heat load. Heat is rejected from the working fluid by a combination of Stirling cycle (traveling wave) heat pumping in the regenerator to a warm-end heat exchanger, and surface (standing wave) heat pumping through the pulse tube to another warm-end heat exchanger.

A more detailed understanding of the fabrication and operation of the invention may be had from the accompanying drawing and detailed description of the invention to follow.

DETAILED DESCRIPTION OF THE INVENTION

Figure 1:
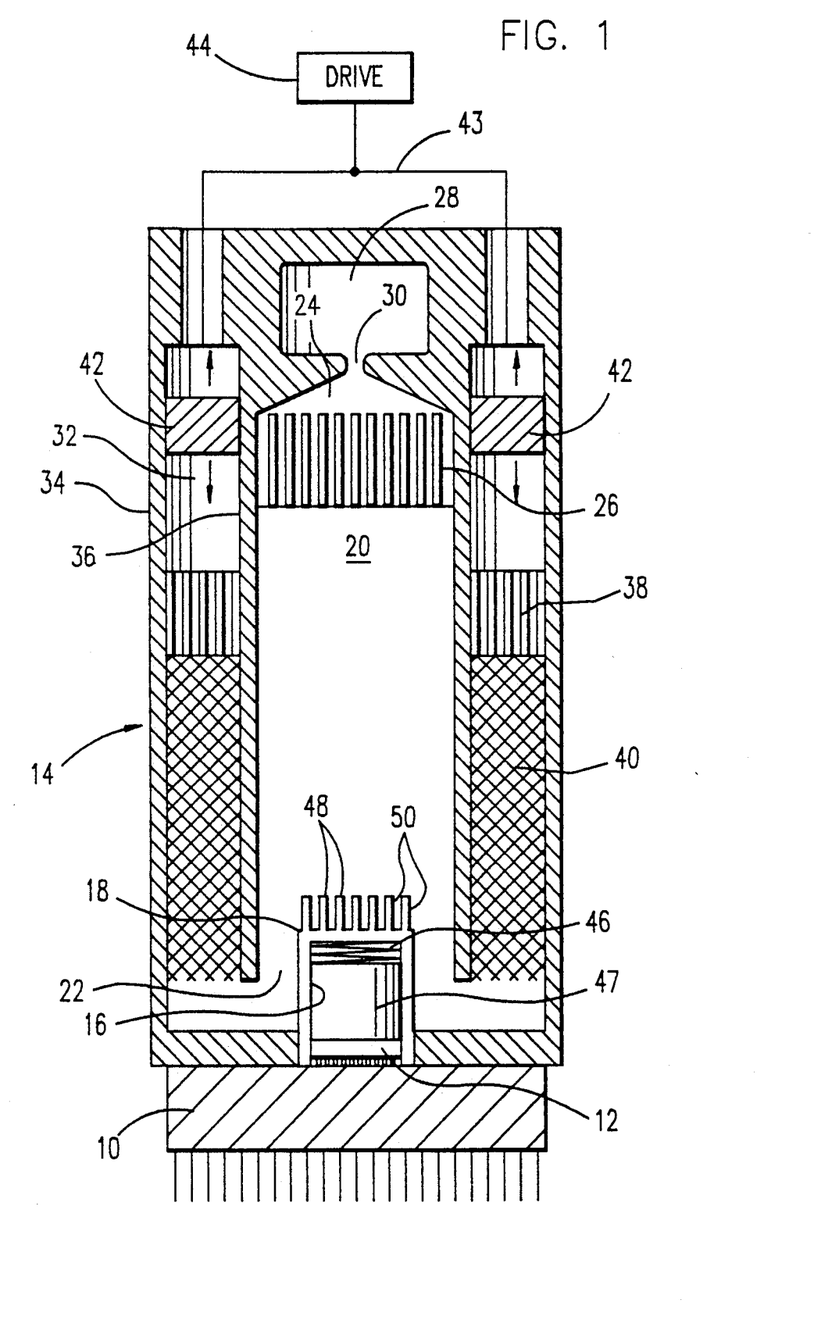
FIG. 1 illustrates, in sectional view, a coaxial design or concentric design pulse tube thermoacoustic refrigeration apparatus in thermally conductive contact with an electronic chip supported on a chip carrier.

Referring to FIG. 1, a chip carrier is provided to support the electronic chip 12. Chip carrier 10 is typically fabricated from ceramic or other materials providing electrical insulation so that electrical conductors may be formed thereon to connect to the chip 12. These materials typically have a very low thermal conductivity. The conductors are not shown.

The chip 12 is attached to chip carrier 10 where solder connections between the terminals of the chip 12 and the conductors supported on the surface of the chip carrier 10 rigidly and electrically bond the chip 12 and carrier 10 together, as is conventional.

In order to cool the chip 12 when it is in operation, a pulse tube thermoacoustic refrigeration device 14 is positioned over chip 12 and attached to chip carrier 10. Chip 12 fits within the confines of chamber 16 formed in the cold end heat sink 18. Cold end heat sink 18 closes the bottom of the pulse tube refrigeration apparatus 14. Thermoacoustic refrigeration apparatus 14 comprises a pulse tube 20 which is substantially a tubular member having an open bottom end 22 and a closed top end 24. The top end 24 of the pulse tube 20 may contain or comprises a heat exchanger 26 which may be referred to as the warm end heat exchanger 26 or the hot end heat exchanger 26. Connected to the top end 24 of the pulse tube 20, is a surge reservoir 28 or a hollow container which is communicatively connected with the chamber formed by the pulse tube 20. The surge reservoir 28 may be integral to the thermoacoustic refrigerator 14 as shown, or remote and joined to the thermoacoustic refrigerator 14 via a tube. In either case, connection of the surge reservoir 28 to the end 24 of pulse tube 20 is through an orifice 30. Orifice 30 restricts the flow of any gas from the pulse tube 20 into the reservoir 28 and, more importantly, controls the timing of flow of the gas between the reservoir 28 and pulse tube 20 as the gas is compressed and decompressed. The reservoir 28 is believed to increase the traveling wave component of the heat pumping.

Warm end heat exchanger 26 is positioned in the region of maximum temperature at the warm end of the pulse tube 20 and will aid in transferring the heat from the gas contained in the pulse tube 20 to the outside walls of the pulse tube 20. Thus, the heat may be dissipated by further transfer to the air or to a cooling fluid, such as water, circulated through the heat exchanger 26.

The pulse tube is surrounded by the outer wall 34 which forms the compression chamber 32 in cooperation with the exterior wall 36 of the pulse tube 20. The lower portion of the annular opening between walls 34 and 36, below the compression chamber 32 includes a finned heat exchanger 38 to act as an aftercooler. Below the aftercooler 38 is a region of the annular opening which is a regenerator 40. Regenerator 40 typically contains wire gauze, commonly copper, over which the gas in the refrigeration system passes.

Connected with the plunger 42, which is an annular ring contained within the compression chamber 32, is a drive mechanism 44. Different types of drive mechanisms may be implemented with the pulse tube refrigeration unit 14. A typical approach would be to use a small electrical motor which oscillates the plunger 42 downward and upward on a regular controlled cycle. A relatively slow cyclical movement of the plunger 42, of a preferred frequency in the order of 1 to 8 Hz. will act to compress and decompress the contents of the pulse tube refrigerator unit 14. In lieu of a direct mechanical drive, the drive 44 may instead be a conventional linear electro-magnetic motor which incorporates plunger 42, and in which electro-magnetic forces displace plunger 42 directly.

Either the electrical motor drive through a mechanical linkage or the magnetic drive is the preferable approach for driving the plunger 42 since both devices may be relatively compact and do not require any external connections other than electrical wiring.

Maximum heat transfer efficiency between the chip 12 and the cold end heat sink 18 is achieved by enclosing a piston 47 within chamber 16. Piston 47 may be biased by a spring 46 to insure that the piston 47 is in intimate face-to-face contact with the top face of electronic chip 12 thereby creating the best possible heat conducting path from chip 12 to the heat sink 18. The heat accumulated and transferred by piston 47 is then conductively conveyed from piston 44 through the helium gas which is contained within the chamber 16 and then through the walls of chamber 16 to the cold end heat sink 18.

An alternative is to fill the volume 51 between the chips 12 and cold end heat exchanger 18 with a highly thermally conductive, dielectric paste or liquid. The thermally conductive paste or liquid may be used between the chip 12 and piston 47 and between the piston 47 and chamber 16 in lieu of the helium gas Cold end heat sink 18 may be further provided with fins 48 to enhance the transfer of the heat from heat sink 18 to the gas contained within pulse tube 20. Fins 48 of the cold end heat sink provide a plurality of heat transfer surfaces 50. It is through these surfaces and contact with the gas contained within pulse tube 20 that the heat transfer occurs, cooling the cold end heat sink 18.

When cryogenic temperatures are to be achieved, the gas chosen for use in the device as the working fluid is preferably helium, due to the fact that it is a good conductor of heat and secondly that it liquifies at 4 Kelvin.

Inasmuch as the device is incapable of cooling to 4 Kelvin, the helium will always remain in a gaseous state and will not liquify and form puddles of a liquid such as might occur with a material having a higher vaporization temperature.

The fact that this device is incapable of cooling the cold end heat sink to a temperature of 4 Kelvin is not a detriment since a 70 Kelvin working temperature is the minimum objective with regard to the temperature of the cold end heat sink and piston, where cryogenic cooling is desired.

As the annular plunger 42 is caused to reciprocate under the influence of drive 44, regardless of whether it is an electrically motor driven mechanical linkage or whether it is a magnetic drive responsive to electrical signals, the helium within the pulse tube refrigeration unit 14, and particularly within the after cooler 38, regenerator 40 and pulse tube 20 undergoes compression as the plunger is forced downward.

During the compression, all elements and molecules of the gas contained in the system, will undergo an increase in temperature. Further, the volume of gas will be shifted from the decompressed state toward the warm end 24 of the pulse tube 20. The compressed state will be maintained for a period of time during which the thermal energy contained within the gas in the region of the warm end heat exchanger 26 will then partially transfer to heat exchanger 26 for dissipation outside the system. Then as the decompression of the gas occurs with the retraction of the annular plunger 42 by drive 44, the gas contained within the refrigeration unit 14 will expand. As it expands, a temperature drop occurs in the gas. As this occurs, a small temperature differential is created between the gas and the cold end heat sink 18. The gas will then absorb thermal energy from the cold end heat sink. As the helium gas is compressed by the plunger 42, the after cooler 38 contained within the annularly shaped regenerator tube will tend to absorb thermal energy from the compressed gases and thereby reduce the gas temperature to some extent. The regenerator 40 acts as a heat or thermal energy storage device whereby the regenerator will absorb thermal energy during the compression portion of the cycle thus reducing the temperature of the gas particularly at that point where the regenerator and the pulse tube communicate and, when the gases undergo expansion, will then give up that energy back to the gas so that the gas will return to its approximately former temperature during the time the gas is being expanded in the regenerator. A more complete understanding of the operation of a pulse tube refrigeration unit of the type described herein may be had by reviewing the several publications and patents identified in the Background of the Invention section above.

The poor thermal conductivity or low thermal conductivity characteristic of ceramic or other materials incorporated into the chip carrier 10 aid in preventing external thermal sources from increasing the thermal load above that of the chip 12. By isolating and insulating chip 12 from external thermal loads and thermal sources, the chip may be more efficiently cooled by the conducting of the heat from the chip 12 to the piston 47 and from the piston 47 to the cold end heat sink 18.

As one can see, this self-contained unit having only an electrical connection for the drive which is used to reciprocate the plunger 42 affecting compression and decompression permits the installation of a compact dedicated refrigeration system inside a small desktop computer or work station, or on a single circuit module in a larger computer, where the need arises to refrigerate a single electronic chip 12 or a small number of chips 12 in order to either assure proper performance or to enhance performance of the electronic circuitry of the computer or work station.

Figure 3:
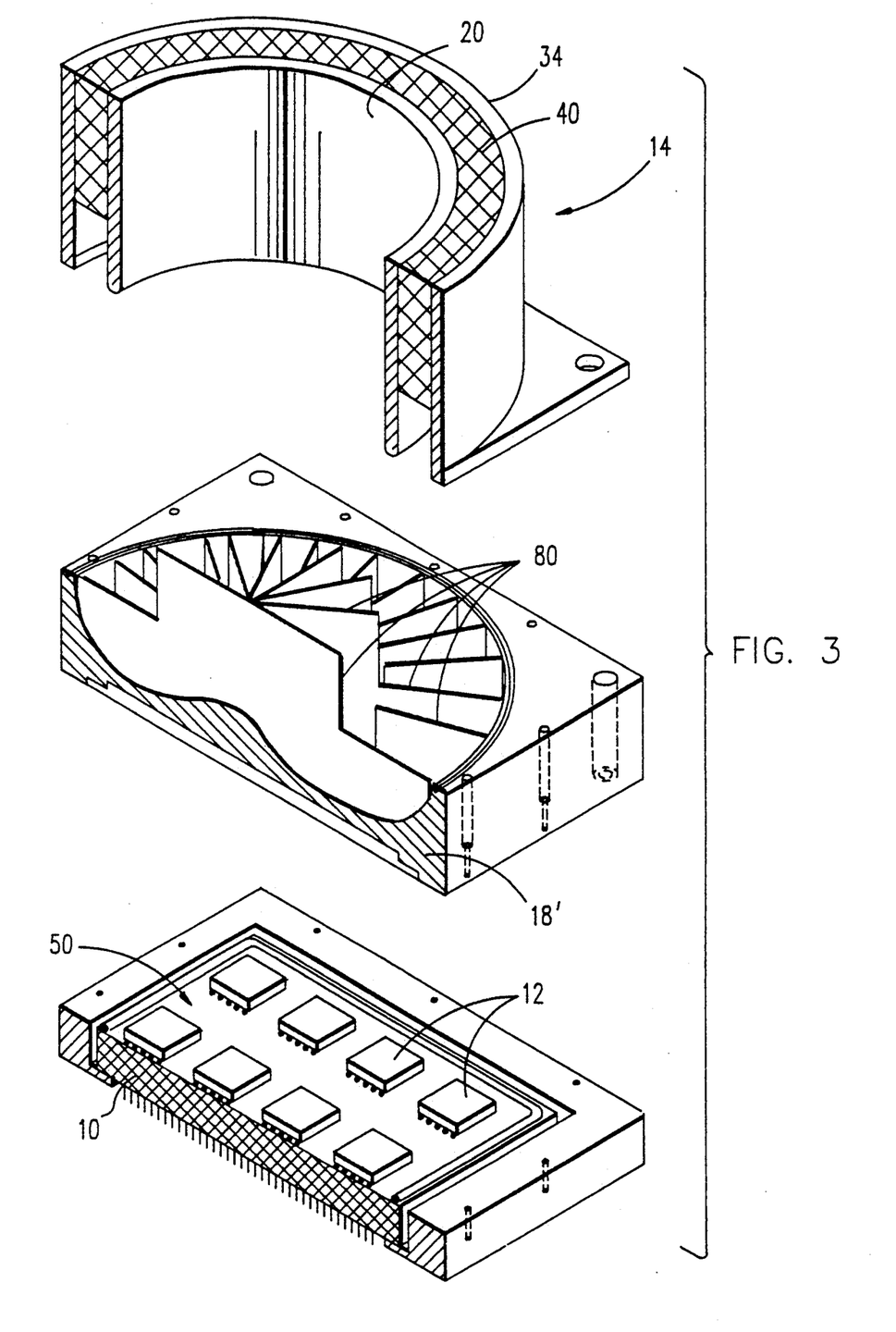
FIG. 3 illustrates an exploded view of the lower portion of the refrigeration apparatus and electronic assembly.
Figure 4:
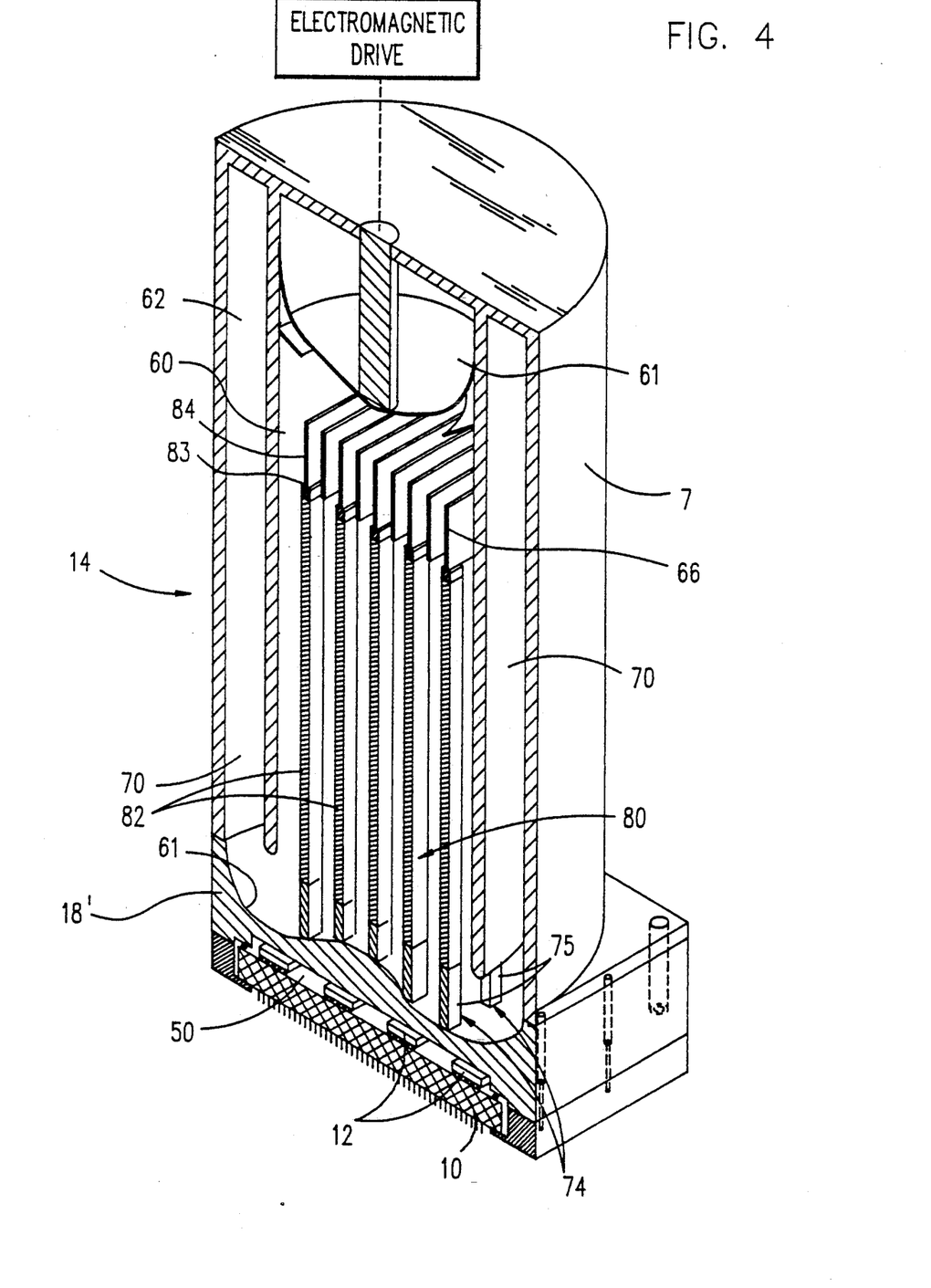
FIG. 4 illustrates a thermoacoustic refrigeration apparatus which utilizes a standing wave surface heat pumping operation.

While it may be desirable to cool the chips 12 to cryogenic temperature levels, it may also be a useful compromise to permit the chips 12 to operate at higher temperatures and use the thermoacoustic refrigerator to several chips to a temperature range of 0° C. to 20° C. The refrigerator may not be capable of cooling several chips to cryogenic levels because of the increased thermal load, but can refrigerate the several chips to the 0° C. to 20° C. range. Multiple chip cooling units are illustrated in FIGS. 2, 3 and 4.

Figure 2:
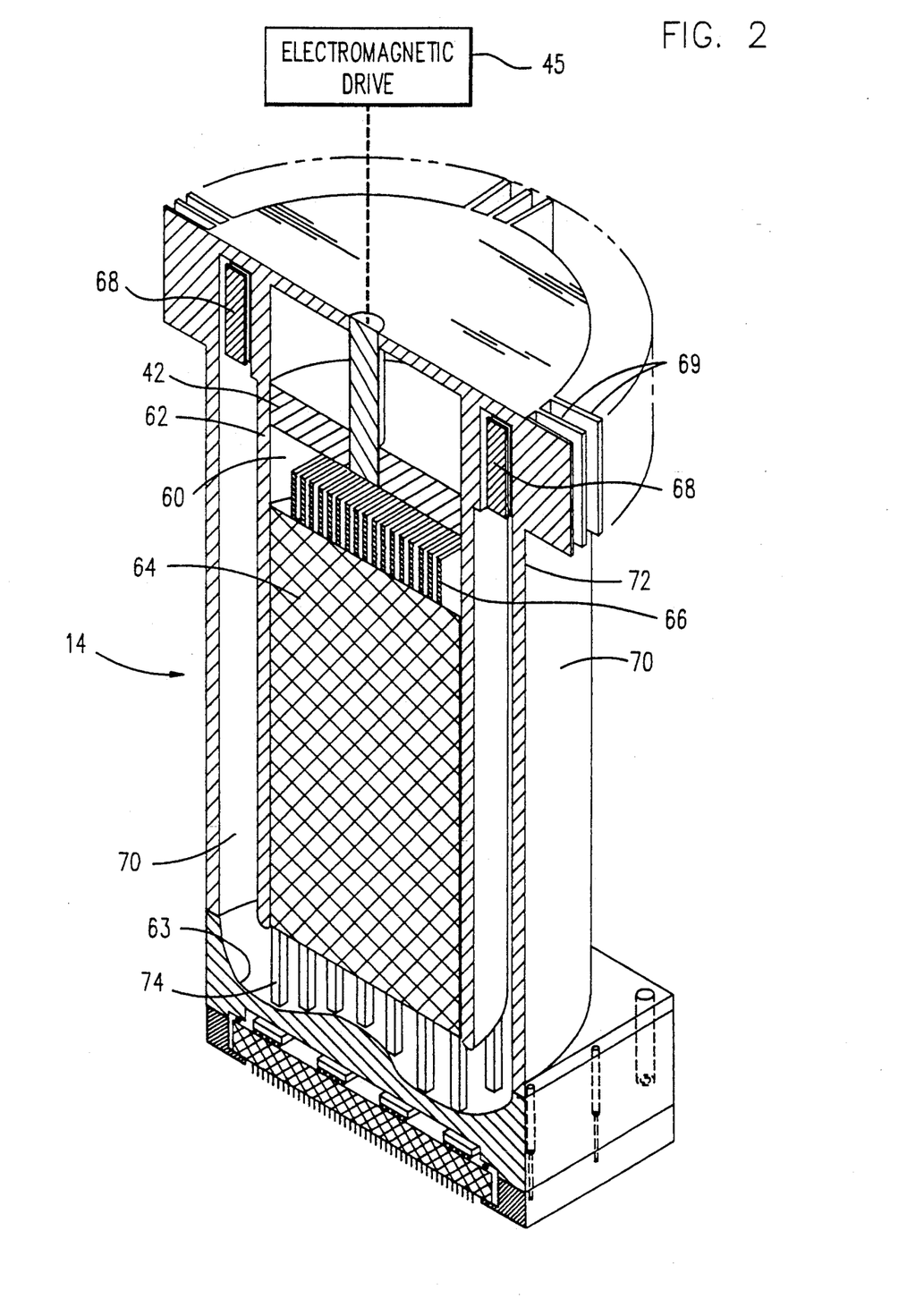
FIG. 2 illustrates a thermoacoustic refrigeration apparatus which is arranged with an annular pulse tube and relies on Stirling cycle type heat pumping with a traveling wave.

The refrigerator 14 may be driven from the warm end 62 of the core volume 60 and have a cylindrical regenerator 64 and annular pulse tube 70 as in FIG. 2. Alternatively, the refrigerator 14 may be driven from the warm end of the annular volume as in FIG. 1, and with an annular regenerator 40 and cylindrical pulse tube 20. Valved compressed gas or mechanically actuated plunger type drives are suitable and may be adapted to either arrangement. A linear motor 45 (magnetically actuated plunger) may be a driver for the desired pressure pulses, thereby reducing the number of moving parts in the system and, increasing the system reliability accordingly. The linear motor 45 may drive a piston 42 in either embodiment. For standing wave refrigerators, the drive 45 may drive a diaphragm 61 to create the pressure pulses. The diaphragm 61 shown in FIG. 4 is best used in an arrangement with a central core volume 60 and annular pulse tube 20.

When the arrangement of the pulse tube 70 is in annular form as in FIG. 2, a hot end heat exchanger 68 is positioned in the hot end of pulse tube 70 and cooled by forced air or water. Alternatively, the top of the walls 72 may be provided with fins 69 to dissipate the heat to the cooling air blown through the computer or terminal housing (not shown).

Figure 5:
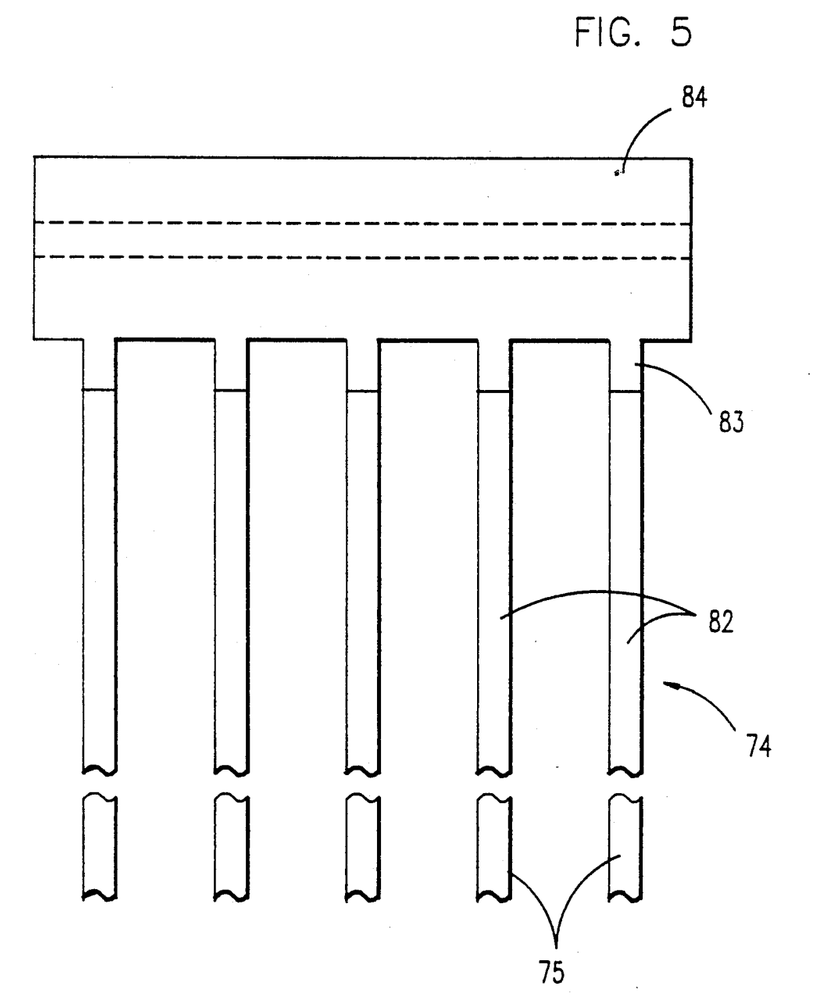
FIG. 5 illustrates the structure of a stack usable in the device of FIG. 4.

Heat may be more efficiently transferred from the cold end heat sink 72 in the FIG. 2 embodiment by populating the upper surface 63 with pins 74 of highly heat conductive material extending into the volume of pulse tube 70 and core volume 60. The gas flow over the pins 74 may be controlled by pin placement and cross-sectional shape. Fins 80 are shown in FIG. 3 as an alternative to pins 74. Heat conducted into the pins 74 is dissipated by convection to a cross-flow of the refrigerator's working fluid. The pins 74 can be staggered so that downstream pins 74 lie outside the wake of those that are immediately upstream, thereby enhancing thermal performance. Furthermore, the pin pitch and/or height may be varied to compensate for spatial variations in the convective cooling or module heat flux, and insure a uniform module temperature. More and/or taller pins 74, for example, would be placed in regions of poorer convective cooling and/or greater heat flux.

Where the heat is primarily transported by the surface heat pumping associated with a standing wave as described in U.S. Pat. No. 4,489,553, a stack 80 is disposed in the central core 60 as in FIG. 4 and is the primary surface along which the heat is pumped. In this embodiment of the invention, heat is dissipated from the circuit module 12 by a co-axial standing wave thermoacoustic heat pump of FIG. 4. Cold end heat sink 18' may be fabricated as a single part which is engaged with the electronic circuit modules 12 and which closes the heat pump working volume. Heat sink 18 may be made of two or more mating pieces which may be separable to permit one piece to be attached to the electronic circuit modules 12. This approach improves serviceability but at the expense of heat transfer efficiency due to contact resistance across the module cooler interface. The precise contour of the flow passage between the cylinder 60 and annular 70 volumes is optimized to facilitate the desired standing pressure wave. An array of pins 74, having a square, round or other suitable cross section, protrude into the cylindrical volume 60 from this contoured surface 61, and form the thermoacoustic stack 80. The pins 74 are optimally spaced for a desired imperfect thermal contact with the working fluid at the resonate operating frequency of the device (which is typically several hundred Hz, much higher than that of a pulse tube). The pins 74 are comprised of a short section 75 of material having a high thermal conductivity at the base, followed by a longer section 82 of a lower thermal conductivity material (to support the desired surface heat pumping), and ending with another short section 83 of high thermal conductivity material. The conductive section 75 at the cold end serves to join the circuit module to the stack 80, while the conductive section 83 at the warm end is used to join the stack 80 to the warm end heat exchanger plates 84. The warm end heat exchanger plates 84 can be a set of parallel plates, each of which is integral to several of the pins 74, as seen in FIG. 5. These plates 84 may have internal coolant flow passages 86, or they may be thermally anchored to the core tube 62, which itself may be cooled by internal coolant flow passages. Other geometries may be advantageous for the surface heat pumping section of the stack 80. The pins that protrude into the core volume can be arranged so that they lie between and provide structural support for parallel plates, concentric cylinders or a spiral, which would be constructed of a lower conductivity material that is suitable for surface heat pumping.

This invention utilizes the thermoacoustic refrigeration technology which has been developed over the past several years in a practical utilitarian application.

Alternative designs of the thermoacoustic refrigeration unit 14 may occur to those skilled in the art, but the best mode of the preferred embodiment is the concentric designed which lends itself to placement over and in contact with the electronic chip or chips 12 on a circuit substrate 10 without occupying excessive quantities of substrate 10 area.

This compact assembly is important since conductors leading to and from the chip must be maintained as short as possible in order to maintain the efficiency of high performance electronic circuits.

Changes, modifications and variations of the disclosed thermoacoustic refrigeration system for cooling electronic circuit chips should remain within the scope of the invention as defined by the accompanying claims.

We claim:

1. A thermoacoustic refrigeration unit for cooling an electronic chip comprising:
   a tube having first and second ends and having an interior and an exterior;
   an annular chamber surrounding said tube, said annular chamber comprising a regenerator chamber and a compression chamber;
   said regenerator chamber communicatively connected to said tube at a first end of said tube;
   a compression means at least partially disposed within said compression chamber and at least partially moveable from a first position to a second position;
   a surge reservoir communicatively connected to said tube at said second end of said tube;
   said second end of said tube comprising a first heat exchanger;
   said annular chamber containing and comprising a second heat exchanger;
   said first end of said tube partially closed by a third heat exchanger extending into said tube and having a heat exchange surface thereon exposed to said tube interior, said third heat exchanger comprising a surface exposed to the exterior of said tube;
   a thermally conductive contacting means disposed in contact with said surface exposed to said exterior of said tube;
   an electronic chip supported on a chip support substrate and disposed proximate said contacting means;
   means for urging said contacting means against said electronic chip;
   said compression chamber, said regenerator and said pulse tube containing a compressible gas;
   whereby displacement of said plunger compresses and decompresses said gas to cool said first end of said tube and said third heat exchanger, and heats said second end of said tube and said first heat exchanger, thereby providing a cooled region of said first end to absorb and transfer heat from said electronic chip to said second end of said tube.

2. The refrigeration unit of claim 1 wherein said regenerator chamber encloses a regenerator region and a heat exchanger cooling region.

3. The refrigeration unit of claim 1 wherein said contacting means comprises a piston and said means for urging comprises a spring.

4. The refrigeration unit of claim 1 wherein said gas comprises helium.

5. The refrigeration unit of claim 1 wherein said contacting means comprises a heat conducting fluid.

6. The refrigeration unit of claim 1 wherein said heat exchangers comprises a plurality of fins exposed to said gas.

7. The refrigeration unit of claim 1 wherein said gas comprises a gas with a temperature of vaporization below the coldest temperature obtainable at said heat exchanging surface.

8. The refrigeration unit of claim 1 wherein at least one of said heat exchangers comprises a plurality of pins extending into said gas.

9. The refrigeration unit of claim 8 wherein said contacting means comprises a piston engageable with said electronic chip.

10. A standing wave thermoacoustic refrigeration and electronic circuit chip cooling unit comprising:
- a thermoacoustic refrigerator containing a working fluid and comprising a warm end heat exchanger and a cold end heat exchanger;
- an electronic chip;
- a chip support means for supporting said electronic chip;
- a surface formed into said cold end heat exchanger;
- a thermally conductive heat transfer means for conducting heat from said electronic chip to said surface of said cold end heat exchanger and means to bias said heat transfer means against said electronic chip;
- means for controllably compressing and decompressing said working fluid: whereby said cold end heat exchanger is cooled and heat from said electronic chip is transferred from said chip to said warm end heat exchanger for dissipation.

11. The cryogenic refrigeration and electronic circuit chip cooling unit of claim 10 wherein said thermally conductive means is biased against said chip.

12. The cryogenic refrigeration and electronic circuit chip cooling unit of claim 11 wherein said thermally conductive means is surrounded within said chamber by a thermally conductive fluid.

13. The cryogenic refrigeration and electronic circuit chip cooling unit of claim 10 wherein said working fluid is helium.

14. The cryogenic refrigeration and electronic circuit chip cooling unit of claim 10 wherein said means for pulsing comprises an electro-magnetic acoustical drive.

15. The cryogenic refrigeration and electronic circuit chip unit of claim 10 wherein said thermoacoustic refrigerator is of a co-axial design.

16. A refrigeration apparatus for cooling an electronic assembly comprising:
- a co-axial thermoacoustic refrigeration means comprising at least a cold end heat exchanger and a warm end heat exchanger;
- a working fluid;
- a cyclical pressurization means;
- said cold end heat exchanger comprising a plurality of heat exchange surfaces disposed within said working fluid;
- and an engagement surface disposed exterior to said apparatus for disposition proximate said electronic assembly;
- heat conduction means for conducting heat disposed intermediate said engagement surface and said electronic assembly;
- whereby heat from said electronic assembly is conducted to said cold end heat exchanger through said engagement surface and transported from said cold end heat exchanger to said hot end heat exchanger.

17. The apparatus of claim 16 wherein said refrigeration means comprises a stack disposed within said refrigeration means and in thermal contact with said cold end heat sink.

18. The apparatus of claim 16 wherein said cold end heat sink is engaged with a thermally conductive paste; said paste further in engagement with said electronics assembly.

19. The apparatus of claim 18 wherein said electronic assembly is fixedly attached to said refrigeration means and in thermal contact with said cold end heat sink.

* * * * *